United States Patent
Huang et al.

(10) Patent No.: US 9,281,496 B2
(45) Date of Patent: Mar. 8, 2016

(54) DISPLAY DEVICE PACKAGING METHOD AND DISPLAY DEVICE

(71) Applicant: InnoLux Corporation, Jhu-Nan, Miao-Li County (TW)

(72) Inventors: Hao-Jung Huang, Jhu-Nan (TW); Tun-Huang Lin, Jhu-Nan (TW); Hao-Yu Chou, Jhu-Nan (TW); Chi-Hsin Lee, Jhu-Nan (TW)

(73) Assignee: InnoLux Corporation, Jhu-Nan, Miao-Li County (TW)

( * ) Notice: Subject to any disclaimer, the term of this patent is extended or adjusted under 35 U.S.C. 154(b) by 0 days.

(21) Appl. No.: 14/281,235

(22) Filed: May 19, 2014

(65) Prior Publication Data

US 2014/0354144 A1  Dec. 4, 2014

(30) Foreign Application Priority Data

May 30, 2013 (TW) .............................. 102119126 A

(51) Int. Cl.
*H01L 51/52* (2006.01)
(52) U.S. Cl.
CPC .................................. *H01L 51/5246* (2013.01)
(58) Field of Classification Search
CPC ................................................... H01L 51/5246
See application file for complete search history.

(56) References Cited

U.S. PATENT DOCUMENTS

| 2006/0082298 | A1 | 4/2006 | Becken et al. |
| 2010/0304513 | A1 | 12/2010 | Nguyen et al. |
| 2012/0235557 | A1* | 9/2012 | Lee ................................. 313/495 |

FOREIGN PATENT DOCUMENTS

EP      1944817 A2      7/2008

* cited by examiner

*Primary Examiner* — Anne Hines
(74) *Attorney, Agent, or Firm* — Muncy, Geissler, Olds & Lowe, P.C.

(57) ABSTRACT

A display device packaging method comprises steps of: providing a first substrate including a display region and a non-display region that surrounds the display region; providing an adhesive material which is disposed on the first substrate and formed into a closed curve surrounding the display region, wherein the closed curve has a start zone and an end zone connected to the start zone; providing a light-blocking element at least covering the end zone; providing a heating source radiating to the light-blocking element and moving the heating source to the start zone of the adhesive material; and scanning the adhesive material from the start zone to the end zone along the closed curve by the heating source. A display device is also disclosed.

6 Claims, 17 Drawing Sheets

DISPLAY DEVICE PACKAGING METHOD AND DISPLAY DEVICE

CROSS REFERENCE TO RELATED APPLICATIONS

This Non-provisional application claims priority under 35 U.S.C. §119(a) on Patent Application No(s). 102119126 filed in Taiwan, Republic of China on May 30, 2013, the entire contents of which are hereby incorporated by reference.

BACKGROUND

1. Technical Field

The invention relates to a display device packaging method and a display device and, in particular, to an OLED display device packaging method and an OLED display device.

2. Related Art

Organic light-emitting diodes (OLED) have several advantages such as self-luminous property, high brightness, high contrast, less volume, less power consumption and fast response, and therefore are gradually applied to various display devices, such as an OLED display device. Although the active matrix type of the OLED display device is made by a more complicated process with the higher cost, it is suitable for the large-scale and high-definition full color display with a large amount of information and therefore has become the mainstream of the OLED display device.

In the conventional packaging method for the OLED display panel, a glass adhesive (such as a fit adhesive) is used to block air and watery vapor from entering into the display panel and thus to avoid the damage of the display panel. The said packaging method includes the steps of: coating the edge of a cover plate 11 with a frit F as shown in FIG. 1A; glazing the frit F by using a laser pre-sintering process; covering the cover plate 11 and the fit F with a back plate (not shown); and implementing a laser sintering sealing process to melt the frit F again to seal the cover plate 11 and the back plate. Accordingly, the packaging process of the display panel is completed.

In the above-mentioned step of glazing the frit by the laser pre-sintering process, a laser beam is emitted to a start zone SZ of the frit F and then scans for a cycle to go back to the start zone SZ. However, a curved gap U will be generated in the start zone SZ as shown in FIG. 1B, resulting in the failure of the following laser sintering sealing process. For example, the gap U causes a loose sealing effect to the display panel.

The gap U is generated because the frit F in the start zone SZ is heated and cooled unevenly due to the different duration of the laser scanning and thus the temperature distribution of the fit F becomes uneven. In FIG. 1B, the left portion of the frit F in the start zone SZ is heated for a longer duration and thus glazed, while the right portion of the fit F in the start zone SZ is heated for a shorter duration and thus not glazed. The different changes of the frit F in the start zone SZ cause the thermal stress causing the break to the connecting interface between the glazed and unglazed portions of frit F, and the gap U is thus generated.

Therefore, it is an important to provide a display device packaging method and a display device so as to avoid generating the curved gap during the pre-sintering process and therefore the yield of the display device packaging method can be enhanced.

SUMMARY

An objective of the invention is to provide a display device packaging method and a display device so as to avoid generating the curved gap during the pre-sintering process and therefore the yield of the display device packaging method can be enhanced.

To achieve the above objective, a display device packaging method according to the invention comprises steps of: providing a first substrate including a display region and a non-display region that surrounds the display region; providing an adhesive material which is disposed on the first substrate and formed into a closed curve surrounding the display region, wherein the closed curve has a start zone and an end zone connected to the start zone; providing a light-blocking element at least covering the end zone; providing a heating source irradiating the light-blocking element and moving the heating source to the start zone of the adhesive material; and scanning the adhesive material from the start zone to the end zone along the closed curve by the heating source.

To achieve the above objective, a display device according to the invention comprises a first substrate, second substrate and an adhesive material. The first substrate includes a display region and a non-display region surrounding the display region. The second substrate is disposed opposite to the first substrate. The adhesive material is disposed between the first and second substrates and formed into a closed curve surrounding the display region. The first substrate, the second substrate and the adhesive material form a sealed space. The adhesive material has at least a gap disposed on a side of the closed curve.

In one embodiment, the adhesive material includes a fit.

In one embodiment, the interval between the light-blocking element and the adhesive material is less than or equal to 10 mm.

In one embodiment, the light-blocking element has an indentation exposing the start zone.

In one embodiment, the heating source irradiates the adhesive material with a first width, the adhesive material has a second width, and the first width is 80%~300% of the second width.

In one embodiment, the power of the heating source is between 3.5 W to 8 W, and the scanning speed thereof is 3 mm/s~10 mm/s.

In one embodiment, after moving the heating source to the start zone, the display device packaging method further comprises a step of: removing the light-blocking element when the heating source scans along the closed curve for a distance.

In one embodiment, the said distance is at least an exposed width on the adhesive material irradiated by the heating source.

In one embodiment, the light-blocking element is a mask having a transparent pattern corresponding to the closed curve.

In one embodiment, the light-blocking element is a mask including at least a shielding pattern which at least covers the end zone.

In one embodiment, after moving the heating source to the start zone, the display device packaging method further comprises a step of: moving the mask to align with the closed curve when the heating source scans along the closed curve for an offset distance.

In one embodiment, after moving the heating source to the start zone, the display device packaging method further comprises a step of: moving the mask so that the shielding pattern doesn't cover the end zone and the non-scanned portion of the closed curve when the heating source scans along the closed curve for an offset distance.

In one embodiment, after scanning to the end zone for a cycle, the display device packaging method further comprises a step of: scanning the start zone again from the end zone by the heating source.

In one embodiment, the display device packaging method further comprises steps of: providing a second substrate disposed on the first substrate and the adhesive material; providing another heating source irradiating the adhesive material from a non-adhesive-material side of the first substrate; and scanning the adhesive material along the closed curve for a cycle by the another heating source.

In one embodiment, when there are two gaps, the gaps are disposed on the opposite sides of the adhesive material, respectively.

In one embodiment, the gaps are not communicated with each other.

In one embodiment, the gap and a surface of the first substrate form a first angle and a second angle along the center line of the closed curve, and the first angle is less than the second angle.

In one embodiment, the first angle is between 10° and 40°, and the second angle is between 30° and 70°.

In one embodiment, the display device is an OLED display device.

As mentioned above, according to a display device packaging method and a display device of the invention, a light-blocking element is used to at least cover the end zone and a heating source is used to irradiate the light-blocking element and then moved to the start zone of the adhesive material. Besides, the heating source advances to scan the adhesive material along the closed curve to the end zone for a cycle. Thereby, when the heating source is moved to the start zone from the light-blocking element, the whole area of the start zone can receive the light of the same energy for the same duration and the accumulated energy can thus make the temperature of the whole area of the start zone exceed the glazing temperature of the adhesive material. Therefore, the curved gap won't be generated in the display device of the invention after the pre-sintering process and the yield of the display device packaging method can be thus enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

Figure 2:
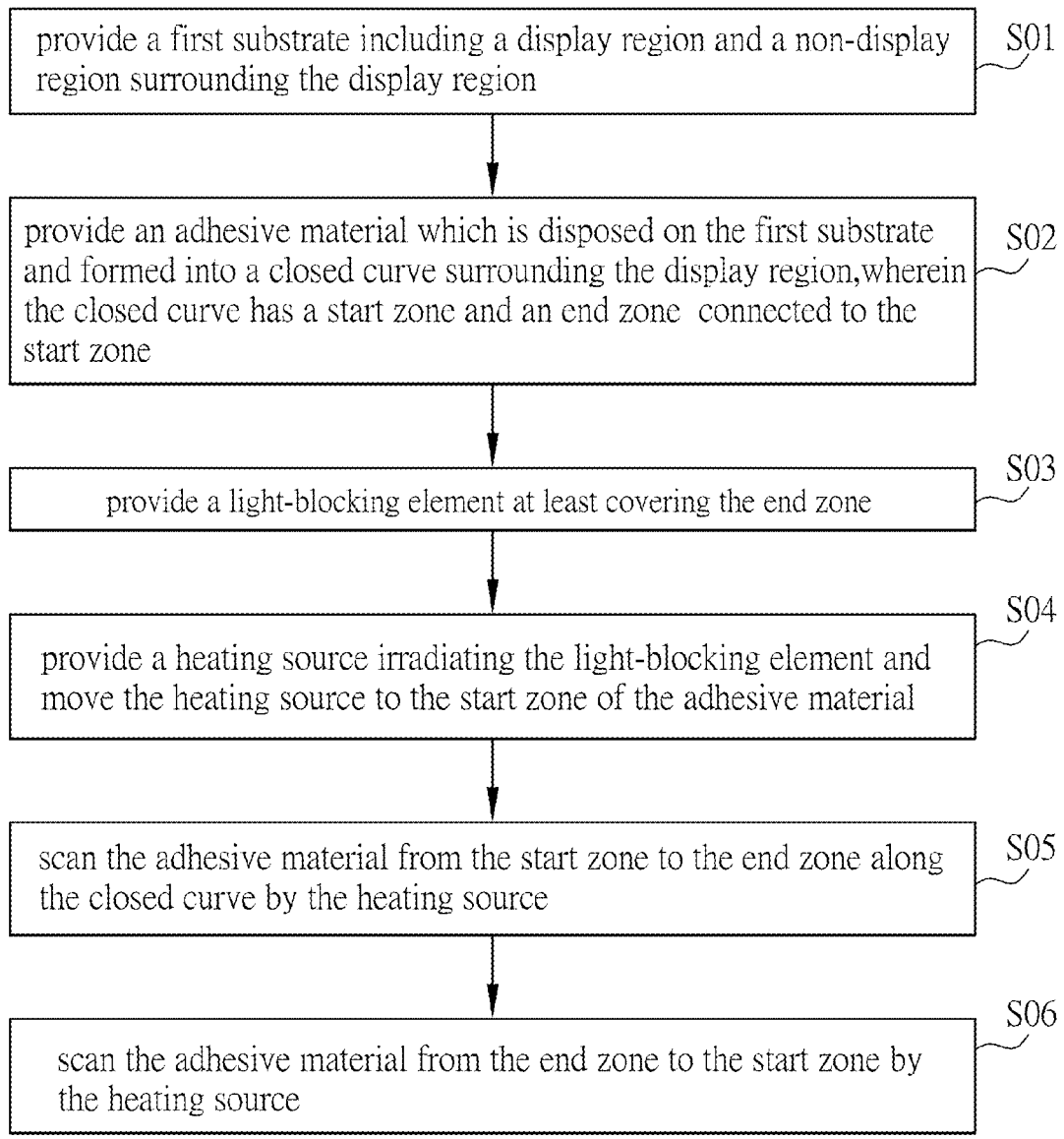
FIG. 2 is a flow chart of a display device packaging method according to an embodiment of the invention.
Figure 3A:
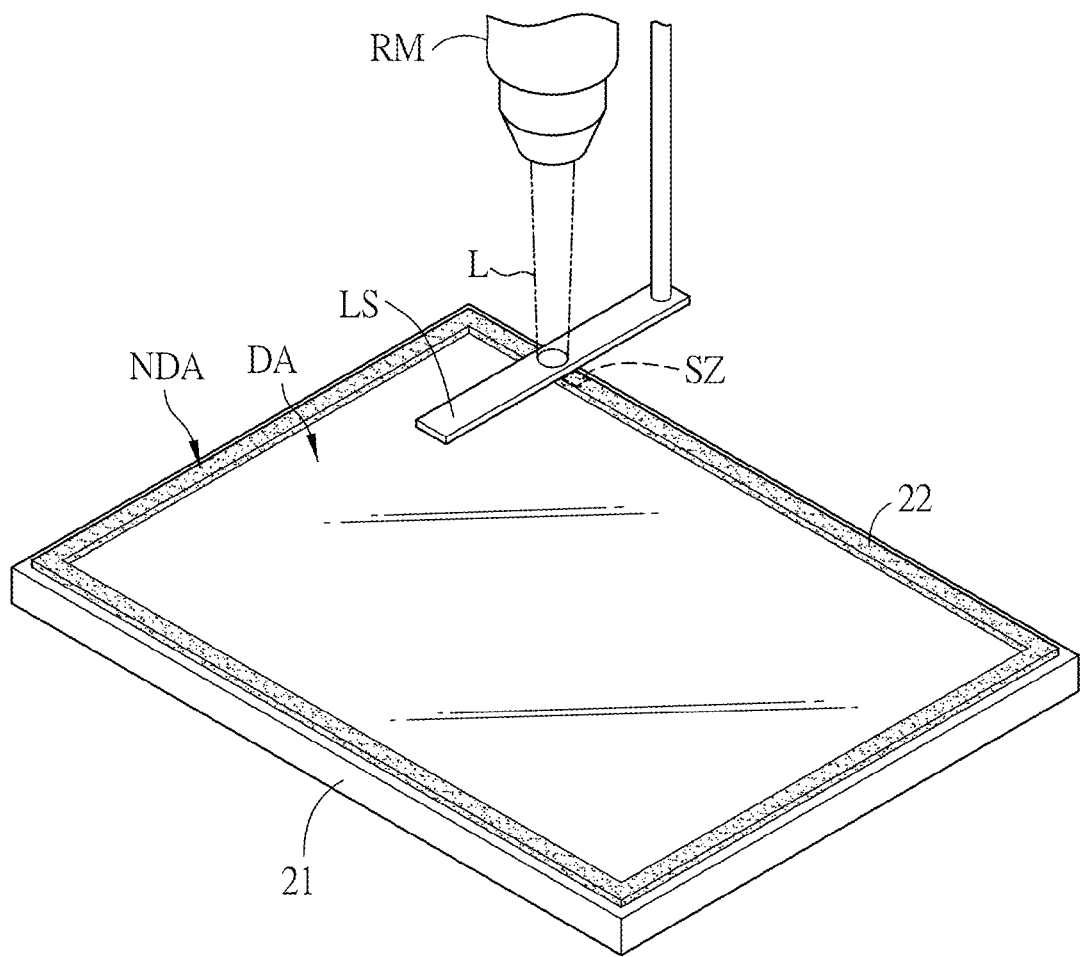
FIGS. 3A to 3C are schematic diagrams of the display device packaging method in FIG. 2.
Figure 3B:
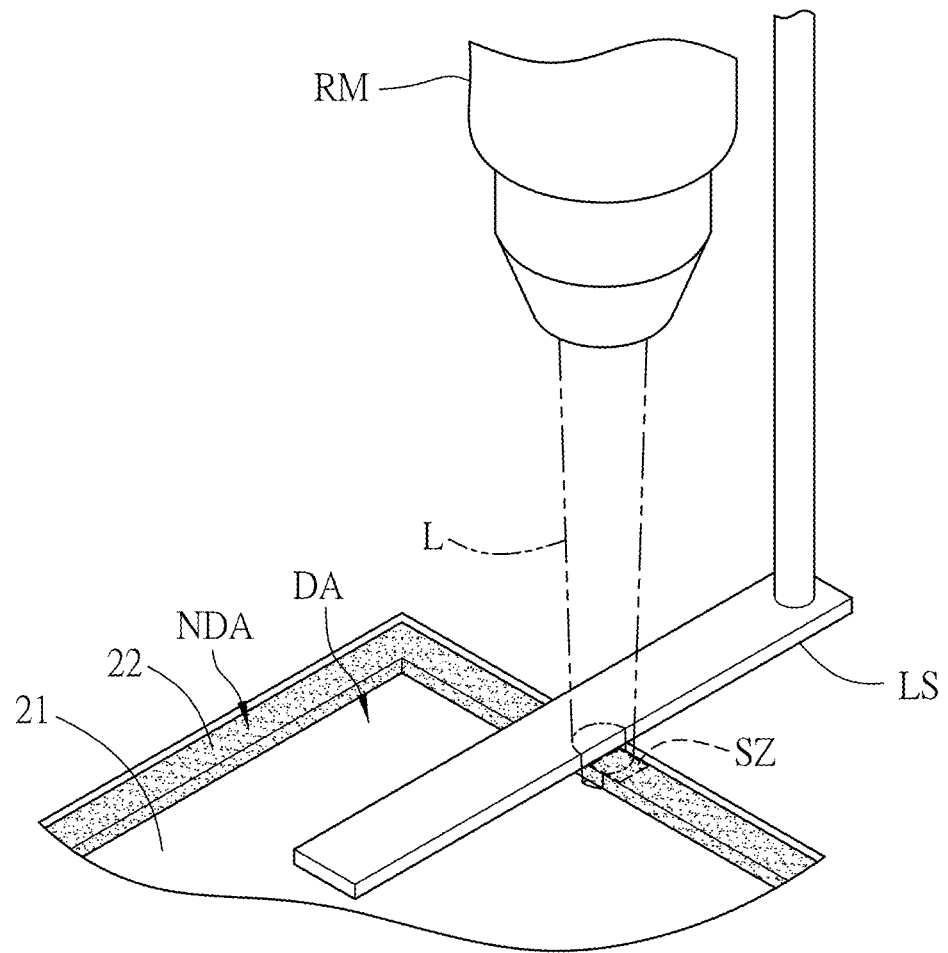
Figure 3C:
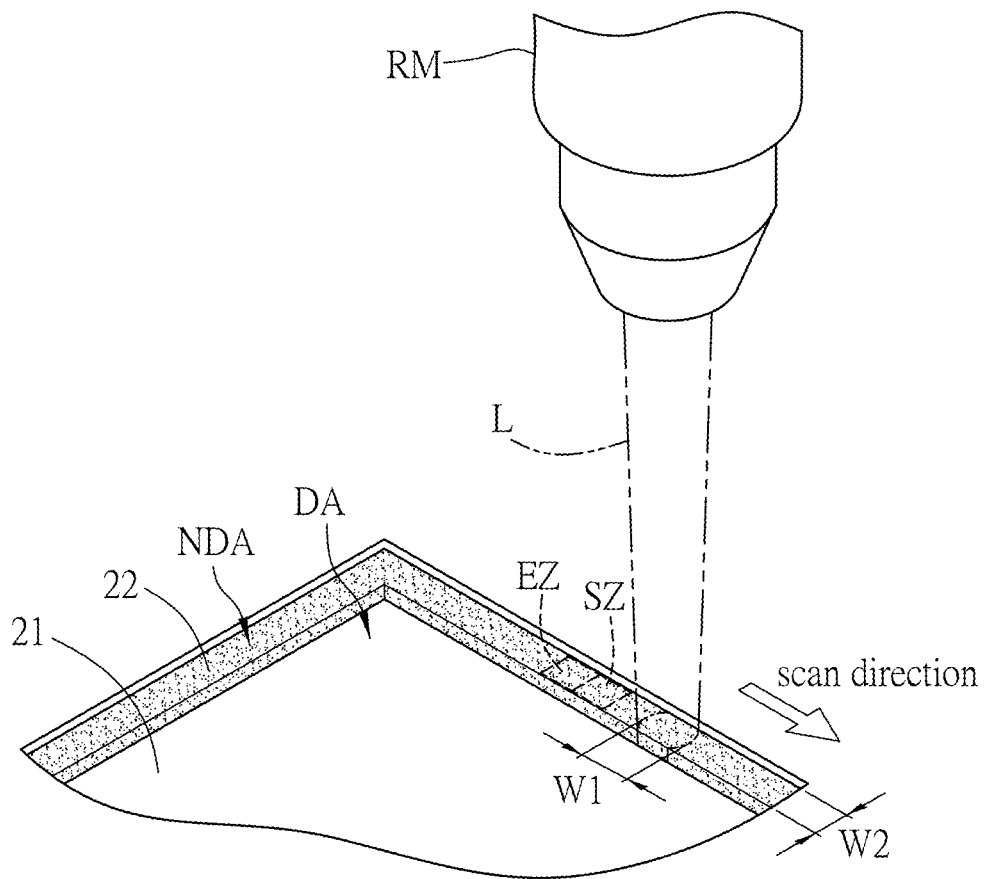

FIG. 2 is a flow chart of a display device packaging method according to an embodiment of the invention, and FIGS. 3A to 3C are schematic diagrams of the display device packaging method in FIG. 2. For example, the display device packaging method of this embodiment is applied to packaging an OLED display device.

As shown in FIG. 2, the display device packaging method includes the steps S01 to S06. Herein, the steps S01 to S06 are shown to illustrate the pre-sintering process of the display device.

First, the step S01 is to provide a first substrate 21 including a display region DA and a non-display region NDA surrounding the display region DA.

The step S02 is to provide an adhesive material 22 which is disposed on the first substrate 21 and formed into a closed curve surrounding the display region DA, wherein the closed curve has a start zone SZ and an end zone EZ (not shown in FIGS. 3A and 3B) connected to the start zone SZ. Herein as shown in FIG. 3A, the said closed curve means that the adhesive material 22 is formed into a loop on the non-display region NDA without any break. The adhesive material 22 can at least include a frit. The said closed curve has, for example but is not limited to, a quadrangular shape (or other shapes otherwise). Besides, the locations of the start zone SZ and the end zone EZ are not limited in the invention. Herein, the start zone SZ and the end zone EZ of the adhesive material 22 are located on the long side of the quadrangular shape (closed curve) for example, and they can be located on the short side or corner otherwise. The start zone SZ denotes the portion of the adhesive material 22 first irradiated by the light beam, and the end zone EZ denotes the portion of the adhesive material 22 that is connected to the start zone SZ and last irradiated along the closed curve.

The step S03 is to provide a light-blocking element LS at least covering the end zone EZ. Herein, the light-blocking element LS in FIG. 3A covers the end zone EZ (so the end zone is not shown) but exposes the start zone SZ. In this embodiment, the light-blocking element LS is a light-blocking plate and can be disposed on a carrying stage carrying the first substrate 21 or on a beam heating module or otherwise. The interval between the light-blocking element LS and the adhesive material 22 is less than or equal to 10 mm. The light-blocking element LS may contact the adhesive material 22.

The step S04 is to provide a heating source L radiating to the light-blocking element LS and move the heating source L to the start zone SZ of the adhesive material 22. Herein as shown in FIG. 3A, the heating source is generated by a laser beam of a laser module RM for example, and irradiates the light-blocking element LS with the optical axis substantially perpendicular to the light-blocking element LS. Because the light-blocking element LS covers the end zone EZ, the heating source L doesn't irradiate the adhesive material 22. Then, as shown in FIG. 3B, the heating source L is moved to scan from the start zone SZ. In this embodiment, the optical power of the laser of the heating source L is between 1 W to 20 W, and the scanning speed thereof is 0.5 mm/s~20 mm/s, and they can be adjusted according to the practical requirements. Herein for example, the power of the heating source L is 3.5 W and the scanning speed is 3 mm/s. If the power of the heating source L is larger, the scanning speed can be increased. In this embodiment, because the light-blocking element covers the end zone, the end zone will not be irradiated by the light beam when the heating source starts to work. In the conventional art, the less scanning speed causes the smaller gap (but the gap is still generated even at a scanning speed of 0.5 mm/s), but the gap will not be generated in the invention even if the scanning speed of the pre-sintering process is increased. Therefore, the manufacturing speed and efficiency can be increased.

The step S05 is to scan the adhesive material 22 from the start zone SZ to the end zone EZ along the closed curve by the heating source L. As shown in FIG. 3C, after the heating source L is moved from the light-blocking element LS to the start zone SZ, the heating source L advances to scan the adhesive material 22 along the closed curve from the start zone SZ and arrives at the end zone EZ for a cycle. To be noted, when the heating source L scans from the start zone SZ along the closed curve for a certain distance, the light-blocking element LS can be removed. The said distance is at least an exposed width (i.e. the first width W1) on the adhesive material 22 irradiated by the heating source L. As an embodiment, after the heating source L finishes irradiating the start zone SZ and continues to advance, the light-blocking element LS can be removed so as not to cover the adhesive material 22. Besides, as shown in FIG. 3C, the heating source L irradiates the adhesive material 22 with a first width W1 and the adhesive material 22 has a second width W2, and the first width W1 is 80%~300% of the second width W2. Thereby, the energy can be focused on the adhesive material 22 to glaze the adhesive material 22.

Figure 1A:
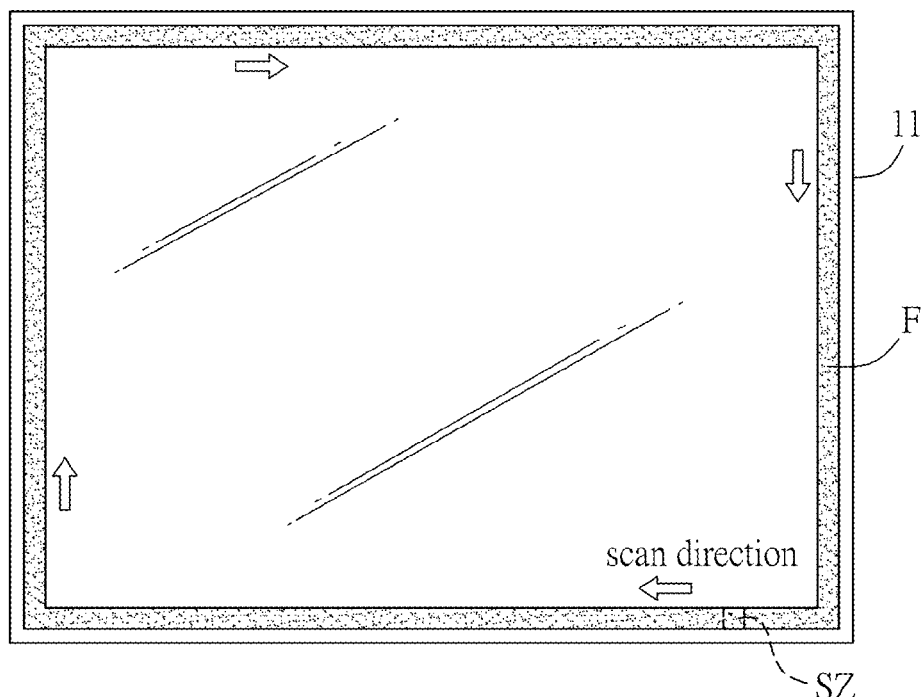
FIG. 1A is a schematic diagram of a conventional sealing process of a display panel.
Figure 1B:
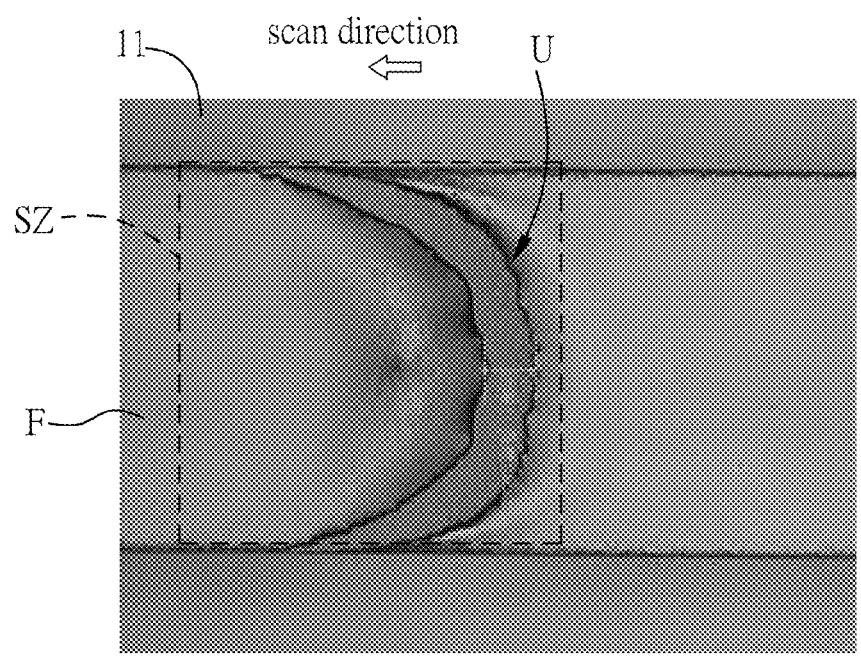
FIG. 1B is a schematic top-view diagram of a curved gap generated in a conventional display panel.
Figure 3D:
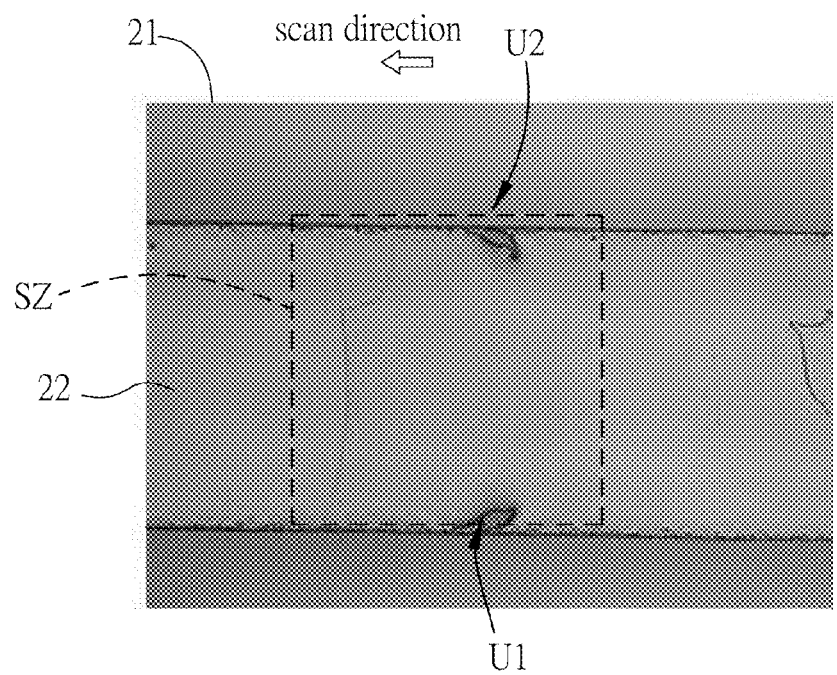
FIG. 3D is a schematic top-view diagram of a part of the display device undergoing the packaging method of the invention.

When the heating source L scans to the end zone EZ for a cycle in the step S05, the step S06 is to scan the adhesive material 22 from the end zone EZ to the start zone SZ by the heating source L for ascertaining all the adhesive material 22 is glazed. Accordingly, the pre-sintering process of the adhesive material 22 is completed. As shown in FIG. 3D, therefore, the curved gap (as shown in FIG. 1B) will not be generated after the pre-sintering process of the adhesive material 22 of this embodiment. The result of the pre-sintering process as shown in FIG. 3D will be illustrated as below.

In the conventional art as shown in FIG. 1B, the left portion of the fit F in the start zone S is heated for a longer duration and thus glazed, while the right portion of the fit F in the start zone S is heated for a shorter duration and thus not glazed. Therefore, the temperatures of the left and right portions are not the same and the gap U is thus generated due to the thermal stress.

Figure 3E:
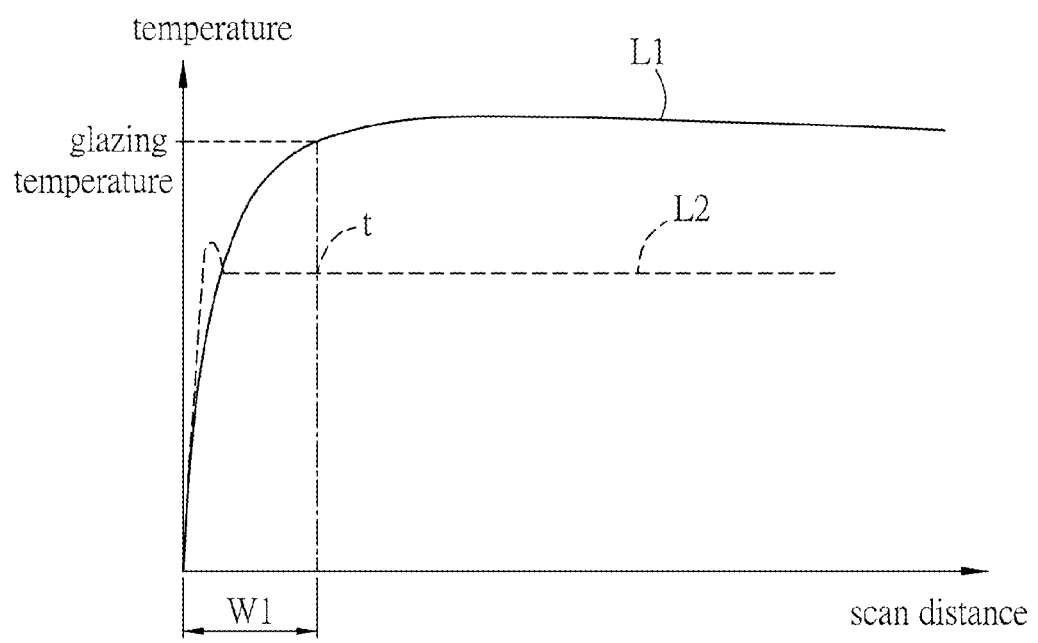
FIG. 3E is a schematic diagram showing the relation between the temperature and the scan distance of the adhesive material.

The reason why the curved gap won't be generated during the pre-sintering process in the invention is illustrated by referring to FIG. 3E. In FIG. 3E, the solid line L1 denotes the temperature of the adhesive material 22 receiving the heating source L, and the dotted line L2 denotes the intensity magnitude of the heating source L. Besides, the ordinate denotes the temperature and the abscissa denotes the scan distance of the heating source L. In addition, t in FIG. 3E denotes the time required for the glazing of the adhesive material 22 receiving the heating source L, and that is to say, the adhesive material 22 can't receive sufficient energy for glazing until the time t.

As shown in FIG. 3E, because the heating duration and the temperature of the whole area of the start zone SZ are both kept the same, the curved gap shown in the conventional art will not be generated in the start zone SZ after the pre-sintering process. As an embodiment, the temperature of the whole start zone SZ is kept exceeding the glazing temperature of the adhesive material 22, or the scanning duration of the heating source L to the start zone SZ is kept exceeding the glazing time t. Therefore, as shown in FIG. 3B, when the heating source L is slowly moved to the start zone SZ from the light-blocking element LS, the whole area of the start zone SZ can be irradiated by the heating source L with the same duration and the same energy, and the accumulated energy can make the temperature of the whole start zone SZ exceed the glazing temperature of the adhesive material 22. Or, the scanning duration to the whole start zone SZ exceeds the glazing time t of the adhesive material 22, so that the accumulated energy makes the temperature of the whole start zone SZ uniformly exceed the glazing temperature of the adhesive material 22. Therefore, the curved gap won't be generated in the start zone SZ after the pre-sintering process in this invention.

Figure 3F:
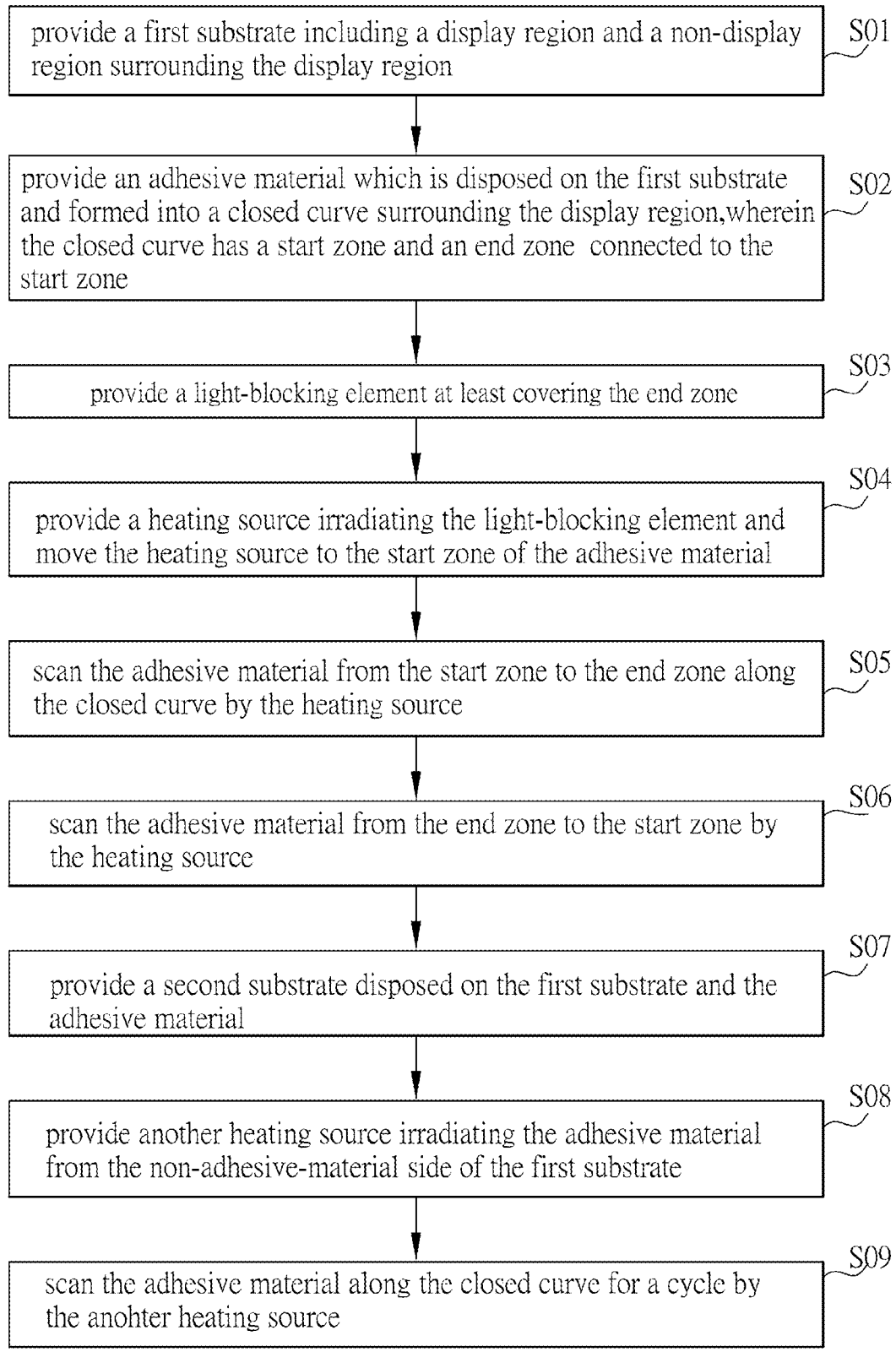
FIG. 3F is a flow chart of a display device packaging method according to another embodiment of the invention.
Figure 3G:
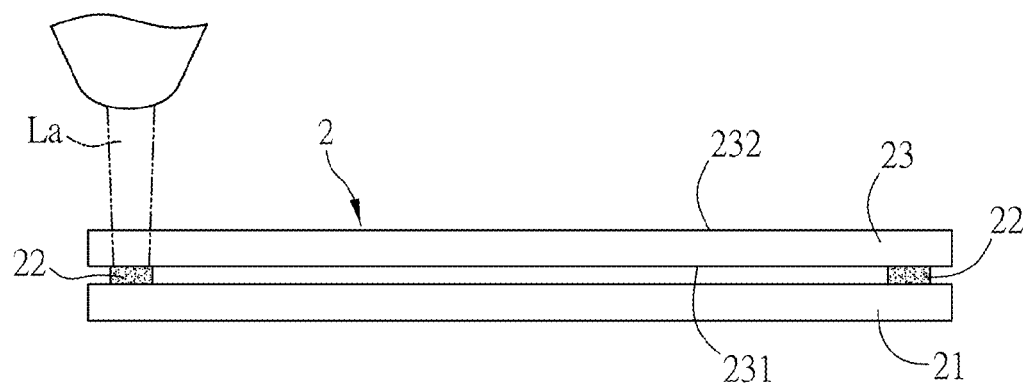
FIG. 3G is a schematic diagram of the display device packaging method in FIG. 3F.

FIG. 3F is a flow chart of a display device packaging method according to another embodiment of the invention, and FIG. 3G is a schematic diagram of the display device packaging method in FIG. 3F.

In addition to the steps S01 to S06, the display device packaging method can further include the steps S07 to S09. Herein, the steps S07 to S09 are for illustrating the sintering sealing process.

As shown in FIGS. 3F and 3G, the step S07 is to provide a second substrate 23 disposed on the first substrate 21 and the adhesive material 22. The second substrate 23 includes a first surface 231 and a second surface 232 opposite to the first surface 231, and the first surface 231 faces the first substrate 21.

The step S08 is to provide another heating source La irradiating the adhesive material 22 from the non-adhesive-material side of the first substrate 21. Herein, the non-adhesive-material side of the first substrate 21 denotes the side of the first substrate 21 without the adhesive material 22 (e.g. the bottom surface of the first substrate 21 in FIG. 3G). However, the heating source La also can irradiate the adhesive material 22 from the second surface 232 of the second substrate 23.

The step S09 is to scan the adhesive material 22 along the closed curve for a cycle by the heating source La. Herein, the heating source La scans the adhesive material 22 from the second surface 232 of the second substrate 22 along the closed curve to complete the sintering sealing process of the display device 2. In this embodiment, the display device 2 is an OLED display device, the first substrate 21 can be a transparent substrate without any film layer, or can be a color filter substrate having a color filter layer, or can be a substrate having a touch circuit, and the second substrate 22 can be an organic light-emitting substrate (having a driving circuit and an organic light-emitting layer).

Figure 4A:
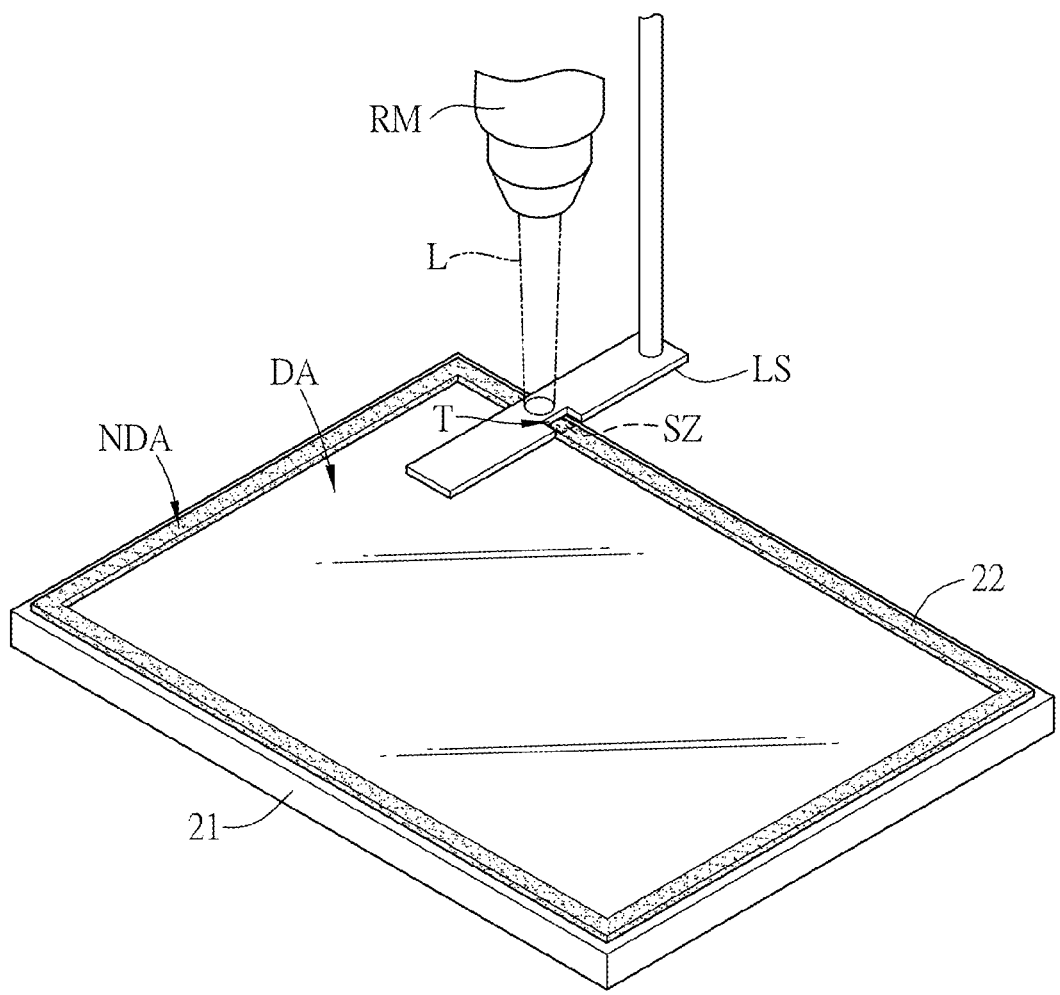
FIGS. 4A and 4B, 5A and 5B, 6A to 6D are schematic diagrams of a display device packaging method according to other embodiments of the invention.
Figure 4B:
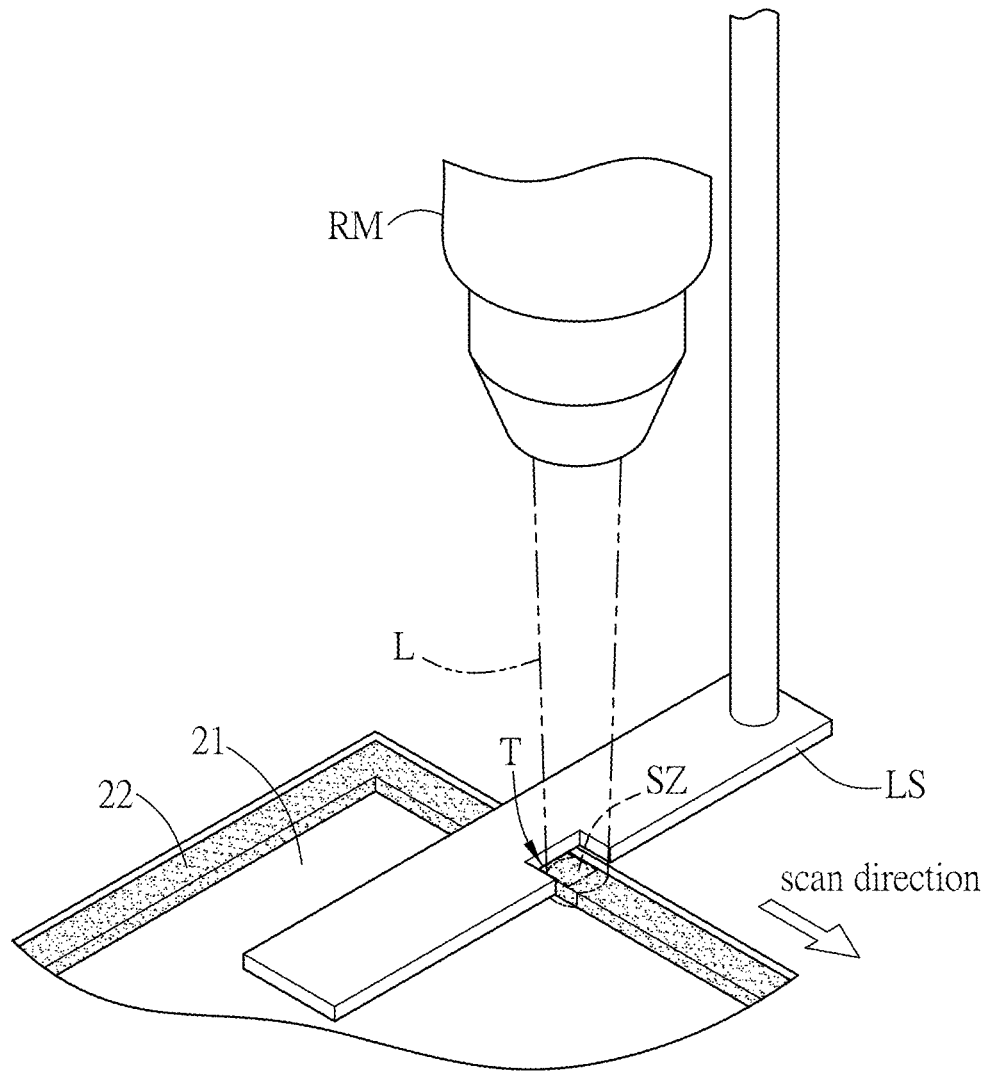

FIGS. 4A and 4B are schematic diagrams of a display device packaging method according to another embodiment of the invention.

As shown in FIGS. 4A and 4B, mainly different from the embodiment of FIGS. 3A and 3B, the light-blocking element LS has an indentation T, which exposes the start zone SZ. In this embodiment, the light-blocking element LS is still a light-blocking plate but has the indentation T exposing the start zone SZ. Therefore, when the step S04 is implemented as the heating source L is moved from the light-blocking element LS to the start zone SZ of the adhesive material 22 as shown in FIG. 4B, the heating source L can irradiate the start zone SZ through the indentation T. The other technical features of the display device packaging method of this embodiment are the same as the foregoing embodiment, and therefore they are not described here for conciseness.

Figure 5A:
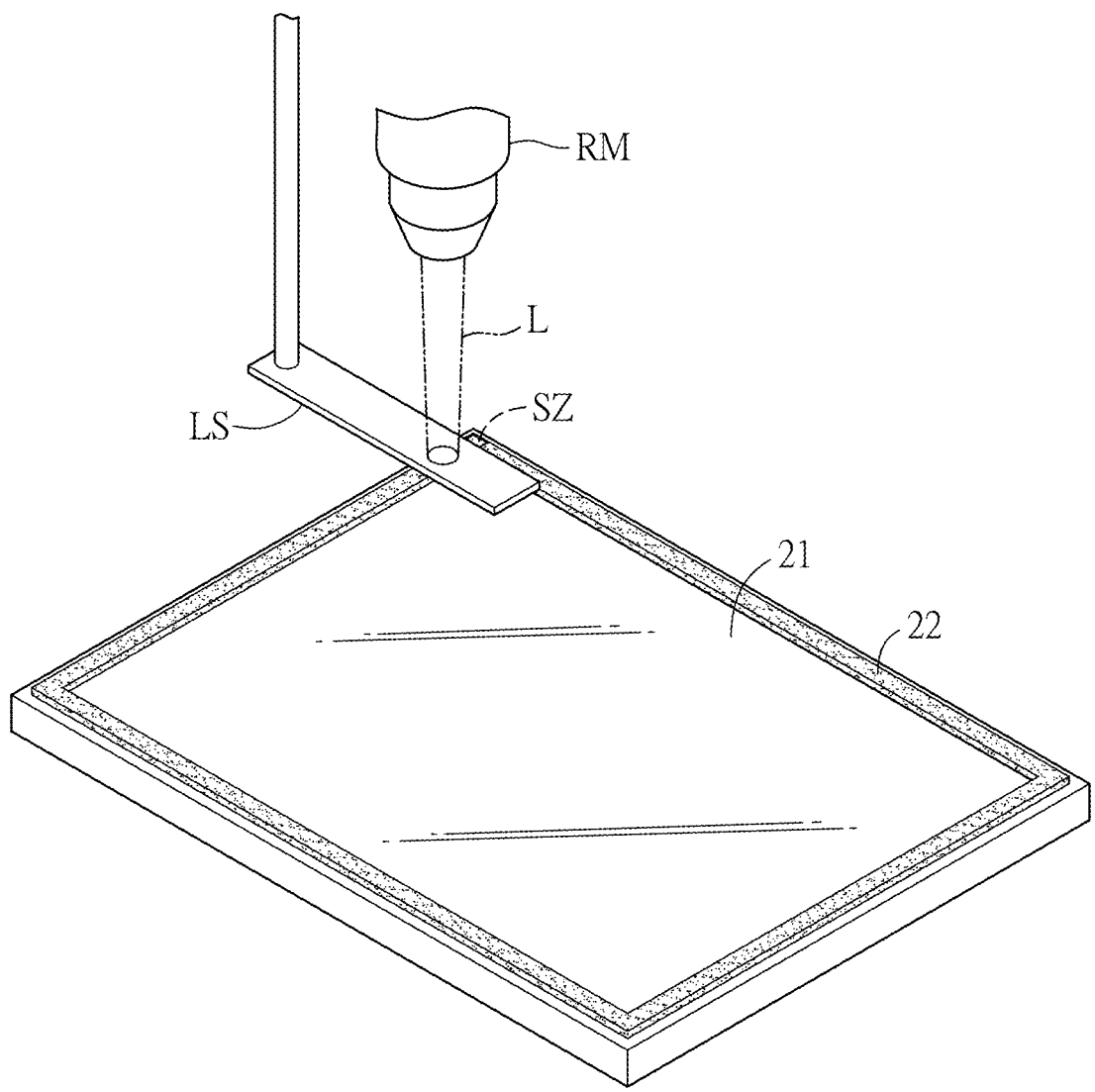
Figure 5B:
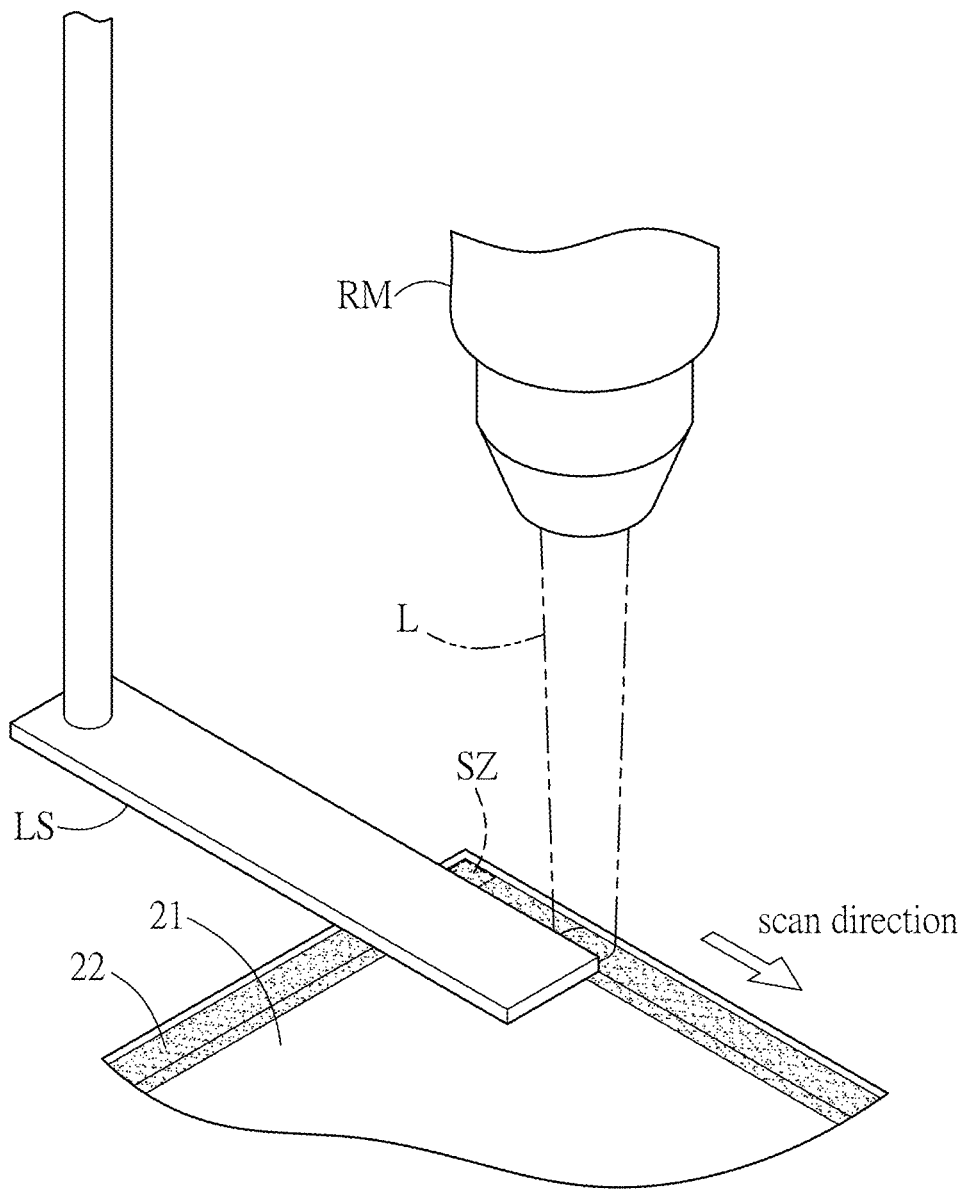

FIGS. 5A and 5B are schematic diagrams of a display device packaging method according to another embodiment of the invention.

As shown in FIGS. 5A and 5B, mainly different from the embodiment of FIGS. 3A and 3B, the start zone SZ and the end zone EZ (not shown) are located on a corner of the closed curve. The light-blocking element LS is still a light-blocking plate and covers the end zone EZ. Therefore, when the steps S04 and S05 are implemented as the heating source L is moved from the light-blocking element LS to the start zone SZ of the adhesive material 22 as shown in FIG. 5B, the heating source L still can advance to scan the adhesive material 22 along the closed curve from the start zone SZ to the end zone EZ for a cycle. The other technical features of the display device packaging method of this embodiment are the same as the foregoing embodiment, and therefore they are not described here for conciseness. To be noted, as shown in FIG. 5A, the light beam of the heating source L is on the light-blocking element LS, but however, the heating source L can first emit the light to other locations and then irradiate the start zone SZ, as long as the adhesive material 22 is not irradiated initially.

FIGS. 6A, 6B, 6C and 6D are schematic diagrams of a display device packaging method according to other embodiments of the invention.

Figure 6A:
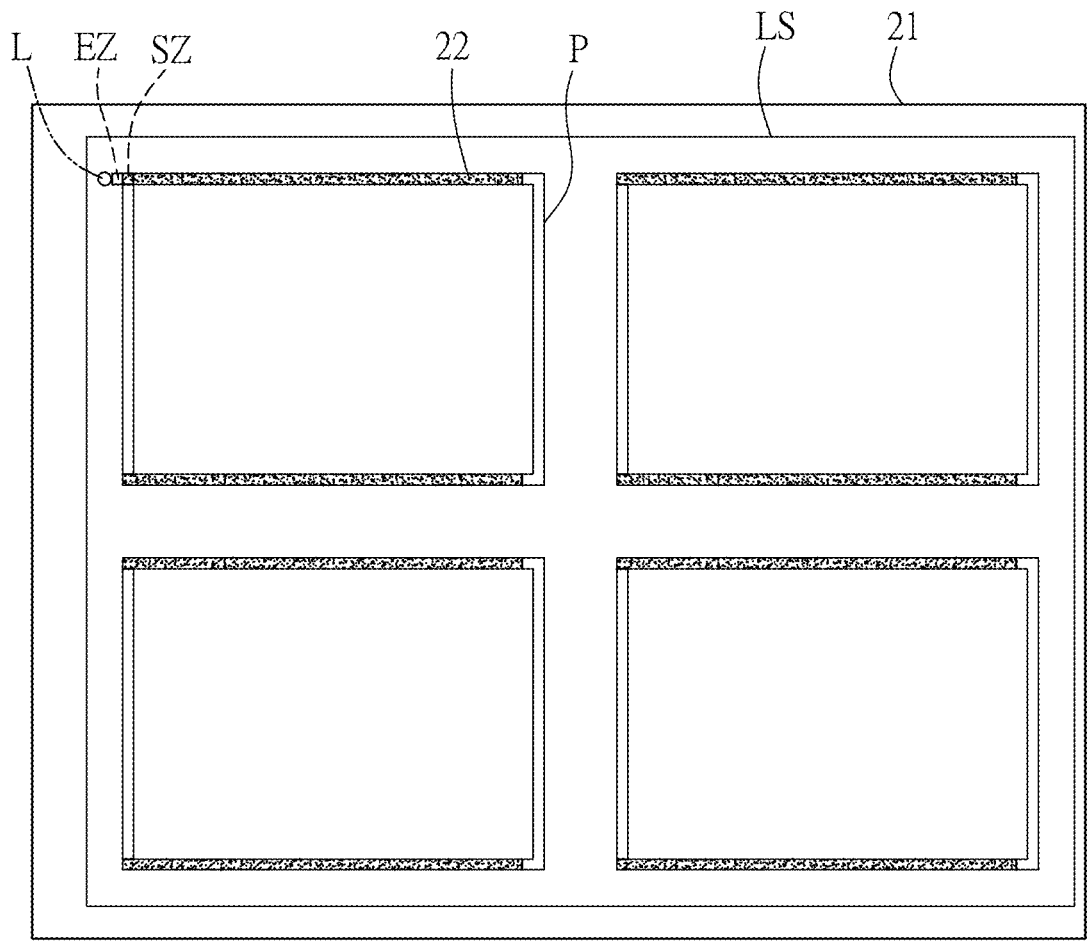
Figure 6B:
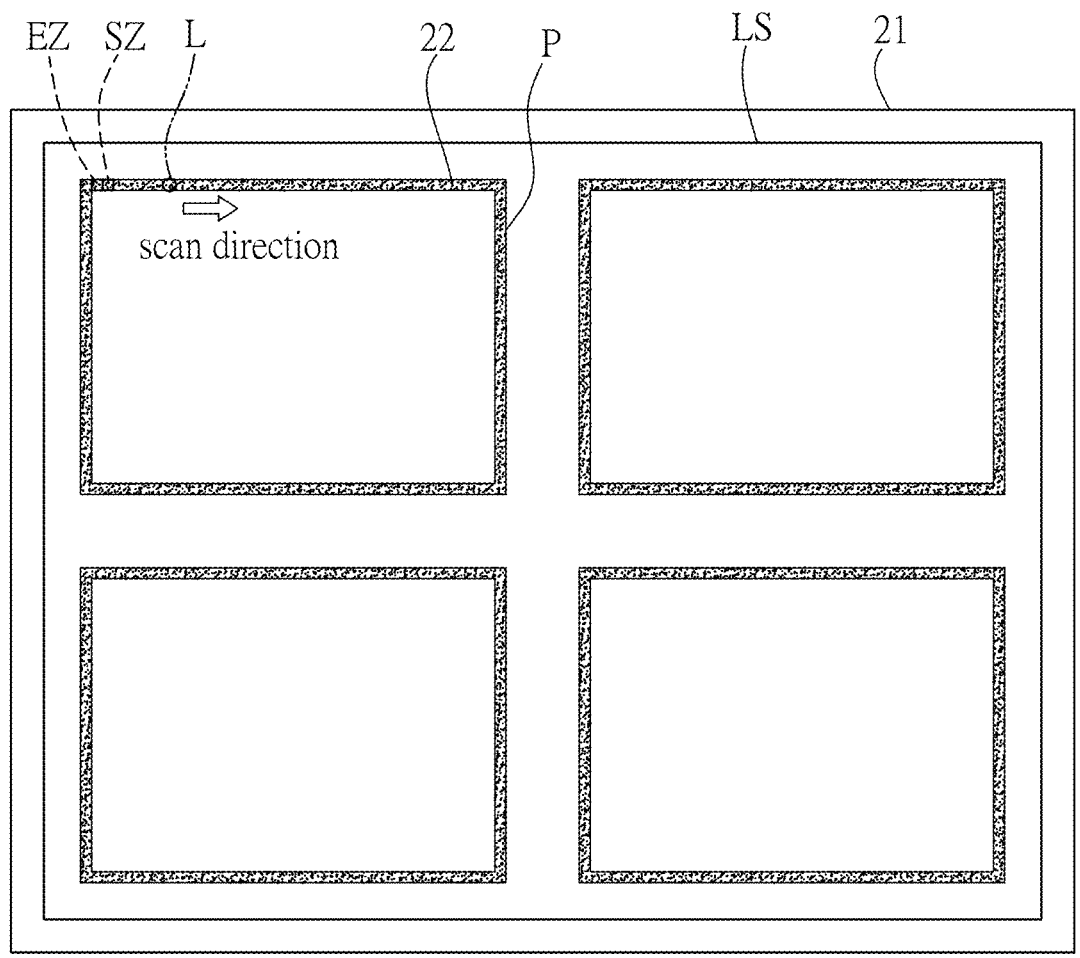

As shown in FIGS. 6A and 6B, mainly different from the embodiment of FIGS. 3A and 3B, the light-blocking element LS is a mask having a transparent pattern P. The transparent pattern P is corresponding to the closed curve. In this embodiment, there are four transparent patterns P corresponding to the four adhesive materials 22, respectively, for example. Besides, the light-blocking element LS is a transparent glass having the transparent pattern P. For the light-blocking element LS, only the transparent pattern P is capable of allowing the light to pass through, so the transparent pattern P can expose the start zone SZ. In FIG. 6A, the transparent pattern P doesn't completely align with the closed curve. When the heating source L is moved to the start zone SZ of the adhesive material 22 by implementing the step S04 and then scans along the closed curve for an offset distance as shown in FIG. 6B, the mask is moved so that the transparent pattern P can align with the closed curve. In other words, when the laser beam is emitted to the start zone SZ as shown in FIG. 6A, the end zone EZ is covered (so it is not shown), and when the heating source L scans along the closed curve from the start zone for an offset distance, the mask is moved so that the transparent pattern P can completely align with the closed curve as shown in FIG. 6B. The offset distance is at least the width of the adhesive material 22.

Figure 6C:
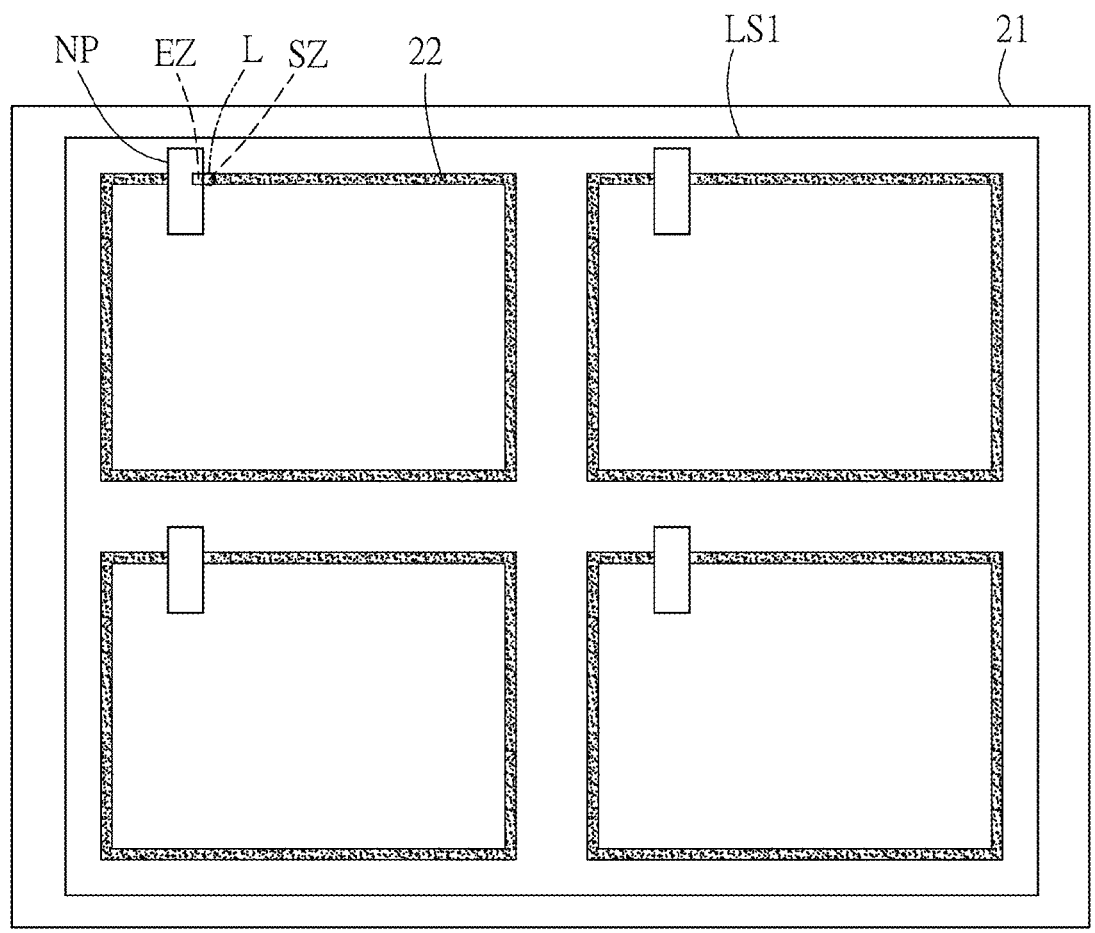
Figure 6D:
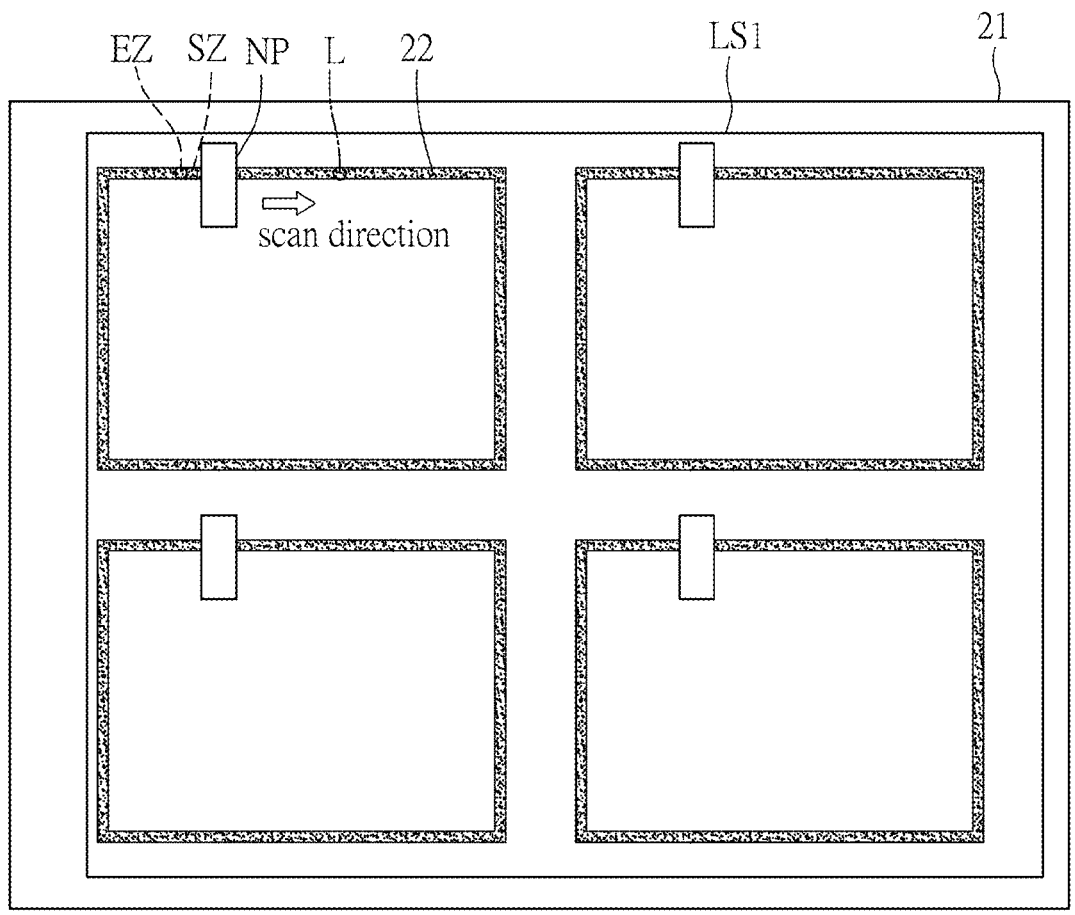

As shown in FIGS. 6C and 6D, mainly from the embodiment of FIGS. 6A and 6B, the light-blocking element LS1 is still a mask but the mask includes at least a shielding pattern NP which at least covers the end zone EZ. Herein, for the light-blocking element LS1, only the shielding pattern NP is capable of blocking the light and the other portion is permeable for the light. In this embodiment, the mask includes a shielding pattern NP covering the end zone EZ for example. Therefore, as shown in FIG. 6C, when the heating source L irradiates the shielding pattern NP, the end zone EZ won't be irradiated by the light because the shielding pattern NP covers the end zone EZ. Besides, when the heating source L is moved (out of the end zone EZ) to irradiate the start zone SZ and scans along the closed curve for an offset distance, the light-blocking element LS1 can be moved so that the shielding pattern NP won't cover the end zone EZ and the non-scanned portion of the closed curve. Therefore, the heating source L still can advance to scan the adhesive material 22 along the closed curve to the end zone EZ for a cycle and then go to the start zone SZ to complete the pre-sintering process.

The other technical features of the display device packaging method of this embodiment can be comprehended by referring to the foregoing embodiments, and therefore they are not described here for conciseness.

Figure 7A:
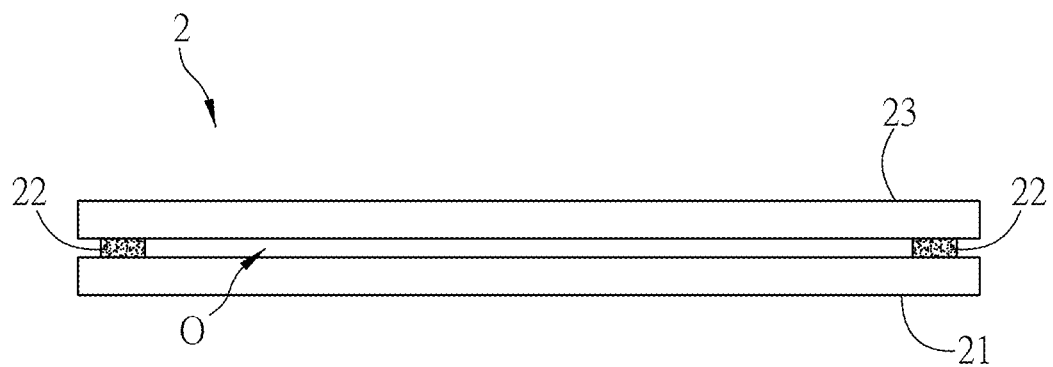
FIG. 7A is a schematic side-view diagram of a display device undergoing the packaging method of the invention.
Figure 7B:
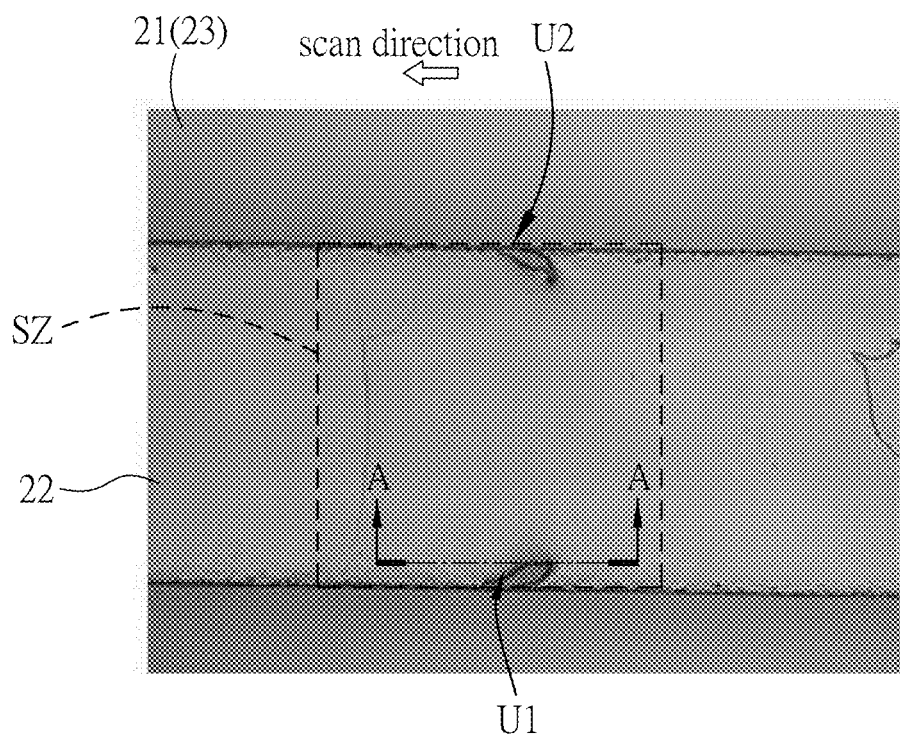
FIG. 7B is a schematic top-view diagram of a part of the display device in FIG. 7A.
Figure 7C:
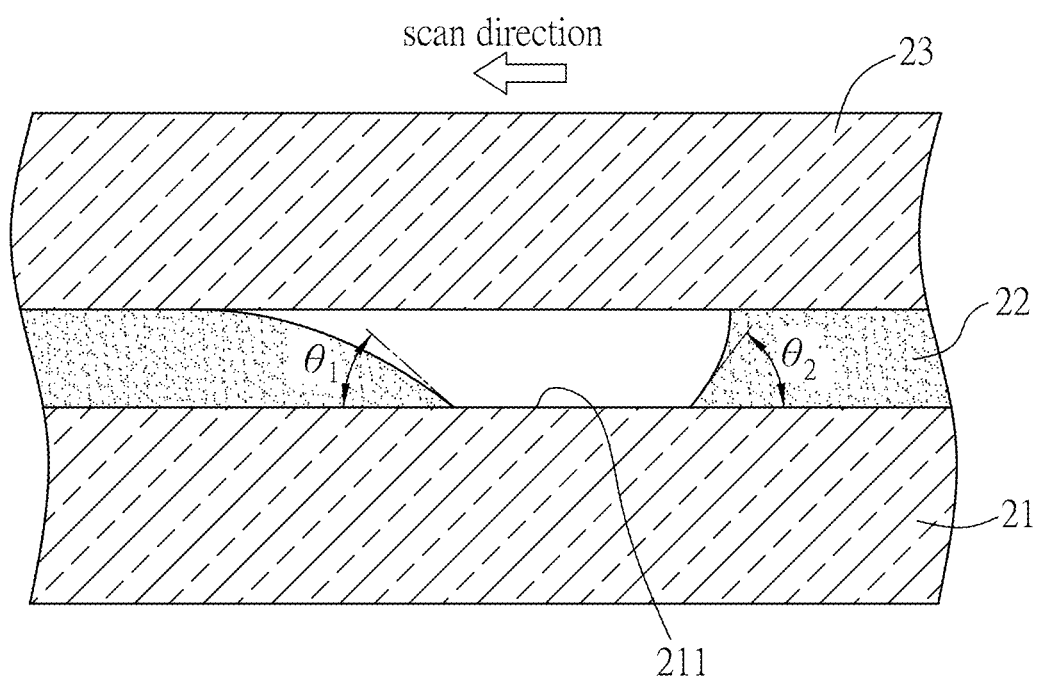
FIG. 7C is a schematic sectional diagram taken along the line A-A in FIG. 7B.

FIG. 7A is a schematic side-view diagram of a display device 2 undergoing the packaging method of the invention, FIG. 7B is a schematic top-view diagram of a part of the display device 2 in FIG. 7A, and FIG. 7C is a schematic sectional diagram taken along the line A-A in FIG. 7B.

As shown in FIG. 7A, the display device 2 includes a first substrate 21, an adhesive material 22 and a second substrate 23. Herein, the display device 2 is an OLED display device. The first substrate 21 can be a transparent substrate without any film layer, or can be a color filter substrate having a color filter layer, or can be a substrate having a touch circuit, and the second substrate 22 can be an organic light-emitting substrate (having a driving circuit and an organic light-emitting layer).

The first substrate 21 includes a display region DA and a non-display region NDA surrounding the display region DA.

The second substrate 23 is disposed opposite to the first substrate 21, and the adhesive material 22 is disposed between the first and second substrates 21 and 23 and formed into a closed curve surrounding the display region DA. The first substrate 21, the second substrate 23 and the adhesive material 22 form a sealed space O. The adhesive material 22 has at least a gap disposed on a side of the closed curve. In this embodiment, there are two gaps as shown in FIG. 7B, and the gaps U1 and U2 are disposed on the opposite sides of the adhesive material 22, respectively, and are not communicated with each other, and therefore the first substrate 21, the second substrate 23 and the adhesive material 22 can form the sealed space O.

As shown in FIG. 7C, the gap U1 and a surface 211 of the first substrate 21 form a first angle $\theta 1$ and a second angle $\theta 2$ along the center line of the closed curve. The first angle $\theta 1$ is between 10° and 40° and the second angle $\theta 2$ is between 30° and 70°. Herein, the first angle $\theta 1$ and the second angle $\theta 2$ will be changed due to different scan speed or heating source L of the pre-sintering process. If the scan direction of the heating source L of the pre-sintering process is from right to left as shown in FIG. 7C, the first angle $\theta 1$ will be less than the second angle $\theta 2$.

In summary, according to a display device packaging method and a display device of the invention, a light-blocking element is used to at least cover the end zone and a heating source is used to irradiate the light-blocking element and then moved to the start zone of the adhesive material. Besides, the heating source advances to scan the adhesive material along the closed curve to the end zone for a cycle. Thereby, when the heating source is moved to the start zone from the light-blocking element, the whole area of the start zone can receive the light of the same energy for the same duration and the accumulated energy can thus make the temperature of the whole area of the start zone exceed the glazing temperature of the adhesive material. Therefore, the curved gap won't be generated in the display device of the invention after the pre-sintering process and the yield of the display device packaging method can be thus enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display device, comprising:
   a first substrate including a display region and a non-display region surrounding the display region;
   a second substrate disposed opposite to the first substrate; and
   an adhesive material disposed between the first and second substrates and formed into a closed curve surrounding the display region,
   wherein the first substrate, the second substrate and the adhesive material form a sealed space, and the adhesive material has at least a gap disposed on a side of the closed curve,
   wherein a first side of the gap and a surface of the first substrate form a first angle along the center line of the closed curve, and a second side of the gap and the surface of the first substrate form a second angle along the center line of the closed curve, and the first angle is less than the first angle.

2. The display device as recited in claim 1, wherein when there are two gaps, the gaps are disposed on the opposite sides of the adhesive material, respectively.

3. The display device as recited in claim 2, wherein the gaps are not communicated with each other.

4. The display device as recited in claim 1, wherein the first angle is between 10° and 40°, and the second angle is between 30° and 70°.

5. The display device as recited in claim 1, which is an OLED display device.

6. The display device as recited in claim 1, wherein the adhesive material includes at least a frit.

* * * * *